(12) United States Patent
Nakatani et al.

(10) Patent No.: US 7,640,654 B2
(45) Date of Patent: Jan. 5, 2010

(54) ELECTRONIC COMPONENT TRANSPORTING METHOD

(75) Inventors: Seiichi Nakatani, Osaka (JP); Seiji Karashima, Osaka (JP); Takashi Kitae, Osaka (JP)

(73) Assignee: Panasonic Corporation, Osaka (JP)

( * ) Notice: Subject to any disclaimer, the term of this patent is extended or adjusted under 35 U.S.C. 154(b) by 365 days.

(21) Appl. No.: 11/701,502

(22) Filed: Feb. 2, 2007

(65) Prior Publication Data

US 2007/0175024 A1    Aug. 2, 2007

(30) Foreign Application Priority Data

Feb. 2, 2006   (JP) ............... 2006-025443

(51) Int. Cl.
*H05K 3/30* (2006.01)
(52) U.S. Cl. .................. 29/760; 29/832; 29/740; 29/739; 29/822
(58) Field of Classification Search ............... 29/25.35, 29/721, 729, 739–742, 760, 791, 795, 822, 29/823, 833, 832, 834; 438/464, 612, 613, 438/6, 106, 107; 382/103, 106, 107; 428/913
See application file for complete search history.

(56) References Cited

U.S. PATENT DOCUMENTS 5,588,195 A * 12/1996 Asai et al. ............... 29/33 M
6,620,345 B2 * 9/2003 Takezawa et al. ............... 252/512

FOREIGN PATENT DOCUMENTS

| JP | 11-068388 | 3/1999 |
|----|-----------|--------|
| JP | 2000-077438 | 3/2000 |
| JP | 2002-007720 | 1/2002 |
| JP | 2003-109397 | 4/2003 |
| JP | 2004-108907 | 4/2004 |
| JP | 2005-033014 | 2/2005 |
| JP | 2005-033014 A * | 3/2005 |

OTHER PUBLICATIONS

T.B. Jones, "An electromechanical interpretation of electrowetting" Apr. 22, 2005, Institute of Physics Publishing, Journal of Microelectronics and Microengineering, #15, pp. 1184-1187.*
Frieder Mugele, Jean-Christophe Baret, "Electrowetting: from basics to applications" Jul. 1, 2005, Institute of Physics Publishing, Journal of Physics: Condensed Matter, #17, pp. R705-R773.*

* cited by examiner

*Primary Examiner*—Derris H Banks
*Assistant Examiner*—Jeffrey Carley
(74) *Attorney, Agent, or Firm*—McDermott Will & Emery LLP

(57) ABSTRACT

A pickup device comprising a pickup surface to which an electronic component retaining liquid is to be applied and capable of adjusting a wet area of the electronic component retaining liquid on the pickup surface is prepared, and the electronic component retaining liquid is applied to the pickup surface in a first step. The electronic component is retained on the pickup surface via the electronic component retaining liquid in a state where the wet area is extended in a second step.

23 Claims, 12 Drawing Sheets

F I G. 2
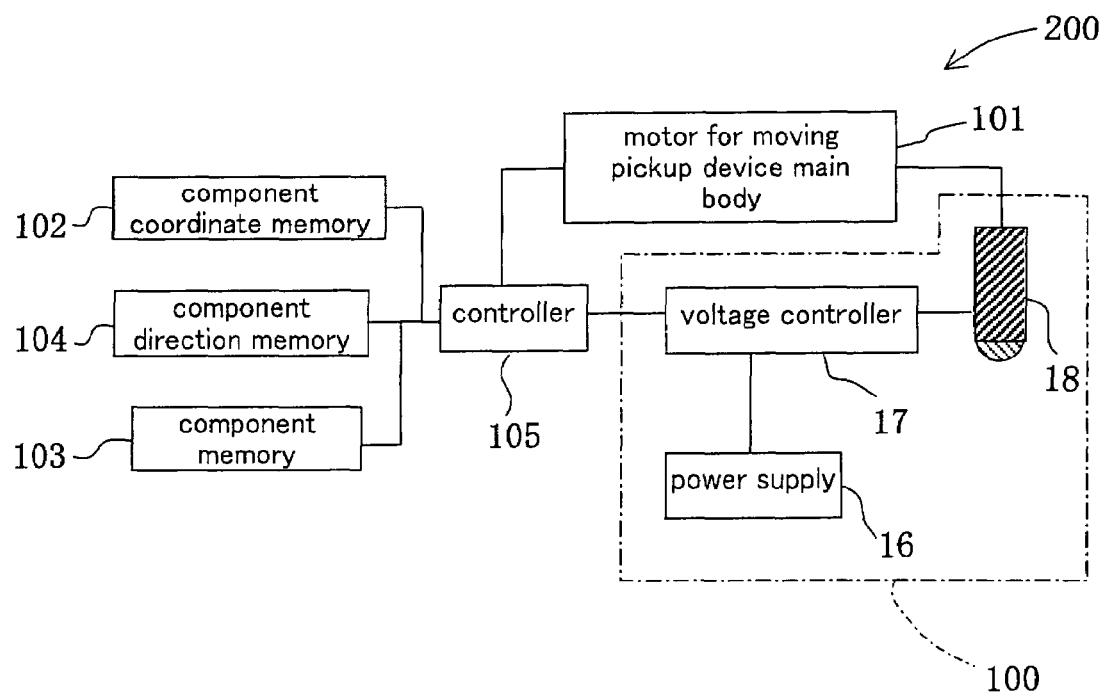

F I G. 1 1 A
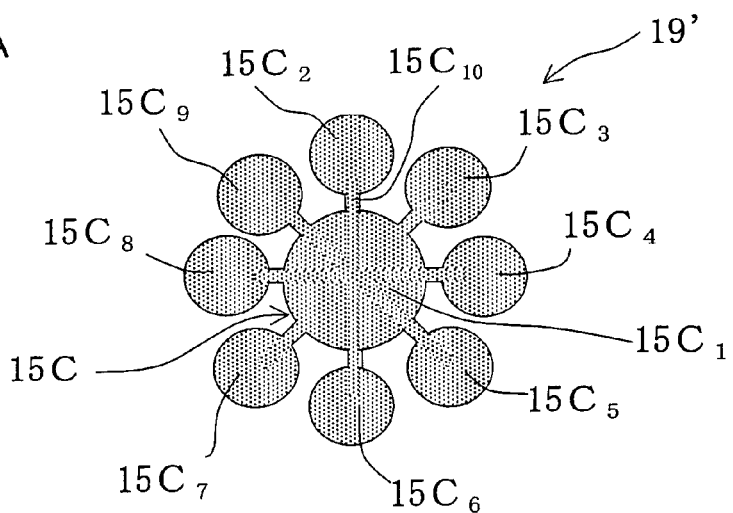
F I G. 1 1 B
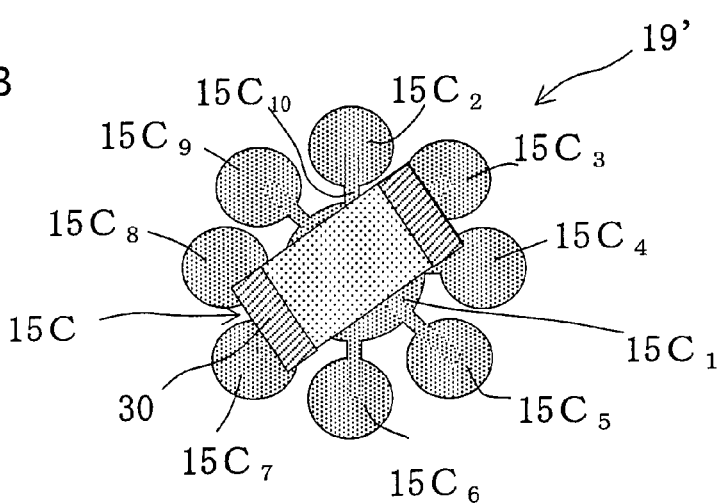
F I G. 1 1 C
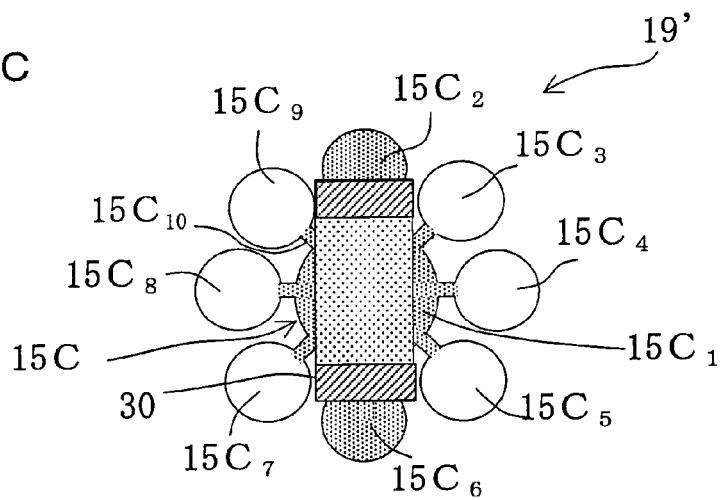

F I G. 1 2
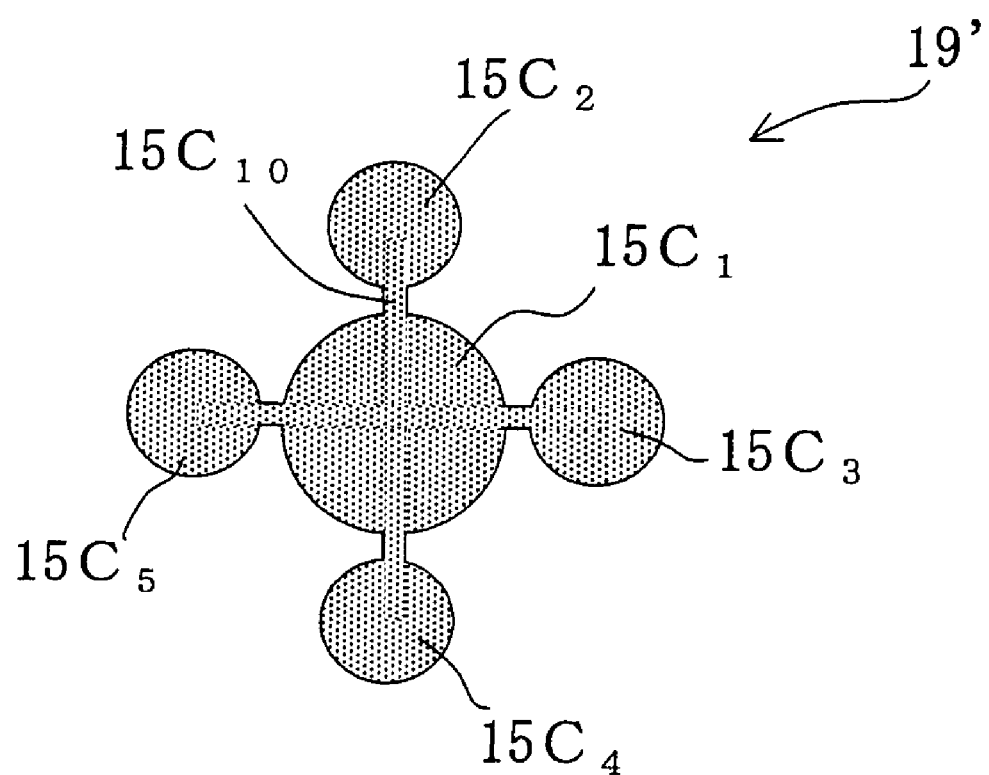

ELECTRONIC COMPONENT TRANSPORTING METHOD

BACKGROUND OF THE INVENTION

1. Field of the Invention

The present invention relates to a method of and a device for transporting an electronic component, and a method of and a device for mounting the electronic component.

2. Description of the Related Art

As tendency of downsizing, thin-model and a higher performance in an electronic device have been advanced in recent years, an electronic component mounted on a print substrate has also been downsized more and more rapidly. A size of chip components (for example, chip resistor, chip capacitor, chip inductor and the like), which is currently length 0.4 mm×width 0.2 mm×height 0.2 mm, is expected to be length 0.1 mm×width 0.05 mm×height 0.05 mm in the future. Further, a size of a semiconductor bare chip that is mainstream, is currently 0.3 mm in square, but it is expected to be reduced to 0.1 mm in square in the future.

In a process for mounting the electronic components having the aforementioned small sizes, as recited in No. 2000-77438 of the Japanese Patent Applications Laid-Open, the electronic component is often mounted on a circuit substrate after it is transported under a state where it is held with a holding tool or adsorbed by a head having a vacuum suction mechanism. However, it is said that it is already almost beyond the technical limits to pick up, transport and mount even an electronic component with the current chip size (chip-type electronic component of 0.4 mm×0.2 mm×0.2 mm, or semiconductor bare chip having the size of 0.03 mm in square). Therefore, it is thought that it may not be possible to pick up, transport and mount a microminiature electronic component even if it is commercialized as a result of further advancements in the downsizing process. In other words, apart from the pursuit of technical innovations for the manufacturing of the microminiature electronic component, there lies another problem we have to face in the future, that is, how the downsized electronic component can be picked up, transported and mounted.

SUMMARY OF THE INVENTION

Therefore, the present invention was implemented in order to solve the problem, and a main object of the present invention is to provide a method capable of transporting and mounting a minute electronic component and a device thereof.

In order to achieve the foregoing object, an electronic component transporting method according to the present invention comprises:

a first step for preparing a pickup device having a pickup surface to which an electronic component retaining liquid is to be applied and capable of adjusting a wet area of the electronic component retaining liquid on the pickup surface and then applying the electronic component retaining liquid to the pickup surface; and a second step for retaining the electronic component on the pickup surface via the electronic component retaining liquid in a state where the wet area is extended.

In a preferable embodiment, a pickup device comprising a conductive layer and an insulation layer laid on the conductive layer a surface of which constitutes the pickup surface is prepared as the pickup device, and an electrolytic solution to which a voltage can be applied between the electrolytic solution and the conductive layer is prepared as the electronic component retaining liquid in the first step, and the voltage is set on a low-voltage side in a region where the voltage is applicable so that the wet area of the electrolytic solution on the insulation layer is extended in the second step.

In another preferable embodiment, the electrolytic solution is made to contact the electronic component in the state where the wet area of the electrolytic solution onto the insulation layer is extended through setting the voltage on the low-voltage side in the voltage-applicable region so as to weaken a surface tension of the electrolytic solution so that the electronic component is retained on the pickup surface by the surface tension of the electrolytic solution in the second step.

In yet another preferable embodiment, it further comprises a third step for separating the electronic component from the pickup surface in a state where the wet area is narrowed after the second step is implemented.

In yet another preferable embodiment, the voltage is set on a high-voltage side in the voltage-applicable region so that the wet area of the electrolytic solution is narrowed in the third step.

In yet another preferable embodiment, the electronic component is separated from the pickup surface in the state where the wet area of the electrolytic solution is narrowed by setting the voltage on the high-voltage side in the voltage-applicable region so as to increase the surface tension of the electrolytic solution in the third step.

In yet another preferable embodiment, the electrolytic solution is made to contact a point to which the electronic component is transported so that the electronic component is moved from the pickup surface together with the electrolytic solution to the point to be transported in the third step.

In yet another preferable embodiment, the second step is implemented after the pickup device is moved to an original position of the electronic component and then the third step is implemented after the pickup device is moved from the original position together with the electronic component to the point to be transported.

In yet another preferable embodiment, a side length of the electronic component is at most 0.2 mm.

In yet another preferable embodiment, the electronic component is a chip component, and a side length of the chip component is at most 0.1 mm.

In yet another preferable embodiment, the electronic component is a semiconductor bare chip, and a side length of the semiconductor bare chip is at most 0.3 mm.

In yet another preferable embodiment, the point to be transported is a wiring substrate on which the electronic component is mounted, and the electronic component is arranged at a mounting position of the wiring substrate by means of the electronic component transporting method according to the present invention.

In yet another preferable embodiment, it further comprises a fourth step for providing a droplet on the electronic component mounting part prior to the third step, and the electronic component retained by the electrolytic solution is made to contact the droplet and thereby moved to the droplet in the third step.

In yet another preferable embodiment, a water-repellent layer is formed on a surface to form the wiring substrate on which the electronic component mounting part except for the electronic component mounting part, and the droplet is then provided on the surface to form the electronic component mounting part in the fourth step.

In yet another preferable embodiment, the droplet is provided on the electronic component mounting part in a shape corresponding to the electronic component in the fourth step, and the electronic component is arranged at the electronic component mounting part in accordance with a shape of the droplet based on self-aligning in the third step.

An electronic component pickup device according to the present invention is an electronic component pickup device capable of retaining an electronic component in a freely detachable manner, comprising:

a conductive layer;

an insulation layer laminated on the conductive layer and comprising a pickup surface for retaining the electronic component on a surface thereof;

an electrolytic solution provided on the pickup surface; and a power supply unit for applying a voltage in a switching manner between the electrolytic solution and the conductive layer, wherein when the electric component is separated, the voltage supply unit applies a voltage higher than the voltage applied between the electrolytic solution and the conductive layer when the electronic component is held.

In yet another preferable embodiment, the voltage supply unit sets the applied voltage on a low-voltage side in a voltage-applicable region thereof so that a surface tension of the electrolytic solution is weakened and a wet area of the electrolytic solution on the insulation layer is extended when the electronic component is held, the voltage supply unit further sets the applied voltage on a high-voltage side in the voltage-applicable region so that the surface tension of the electrolytic solution is increased and the wet area of the electrolytic solution on the insulation layer is narrowed when the electronic component is separated.

In yet another preferable embodiment, an electronic component transporting device comprises:

the electronic component pickup device according to the present invention;

a mover for moving the electronic component pickup device from an original position of the electronic component to a destination of the transportation;

a memory for memorizing data in relation to the transportation of the electronic component; and a controller for controlling the mover based on the data memorized in the memory, wherein the voltage supply unit sets the applied voltage on the low-voltage side in the voltage-applicable region during a period when the electronic component pickup device is at the original position and a period when the electronic component pickup device is moved from the original position to the destination, and sets the applied voltage on the high-voltage side in the voltage-applicable region at the point to be transported.

In yet another preferable embodiment, the mover makes the electrolytic solution contact the electronic component so that the electronic component is retained on the pickup surface by the electrolytic solution whose wet area is extended at the original position, and makes the electrolytic solution contact the destination point so that the electrolytic component is separated from the pickup surface together with the electrolytic solution whose wet area is narrowed, and moved to the destination point.

In yet another preferable embodiment, the voltage supply unit comprises an electrode for applying the voltage to the surface of the insulation layer, and the electrode comprises a plurality of linear electrode parts arranged in a radial shape, and the voltage supply unit supplies the voltage separately to the linear electrode parts in accordance with a desired direction of the electronic component when the electronic component is held.

In yet another preferable embodiment, an electronic component mounting device according to the present invention comprises:

the electronic component transporting device according to the present invention; and a stage mover for moving a wiring substrate provided at the transportation point on which the electronic component is mounted relatively to the electronic component transporting device.

According to the present invention, as the electronic component pickup device for picking up the electronic component is moved together with the electronic component by the surface tension of the electrolytic solution, even a minute electronic component can be transported easily. Further, the wet area of the electrolytic solution is changed so that the electronic component can be released. According to the present invention, the electronic component can be picked up and released more speedily than in the mechanical constitution where the electronic component is held by means of the vacuum suction method or with the holding tool. As a result, the electronic component can be mounted with a high efficiency.

According to the present invention, the method of transporting and mounting the minute electronic component and the device thereof can be provided.

BRIEF DESCRIPTION OF THE DRAWINGS

These and other objects as well as advantages of the invention will become clear by the following description of preferred embodiments of the invention. A number of benefits not recited in this specification will come to the attention of those skilled in the art upon the implementation of the present invention.

FIG. 2 is a block diagram showing a constitution of an electronic component transporting device according to the preferred embodiment.

FIG. 11A is a first drawing illustrating a constitution of a pickup device main body and a position aligning process of the electronic component according to the another preferred embodiment.

FIG. 11B is a second drawing illustrating the constitution of the pickup device main body and the position aligning process of the electronic component according to the another preferred embodiment.

FIG. 11C is a third drawing illustrating the constitution of the pickup device main body and the position aligning process of the electronic component according to the another preferred embodiment.

FIG. 12 is a drawing showing a constitution of a pickup device main body according to yet another preferred embodiment.

DETAILED DESCRIPTION OF THE INVENTION

Figure 1A:
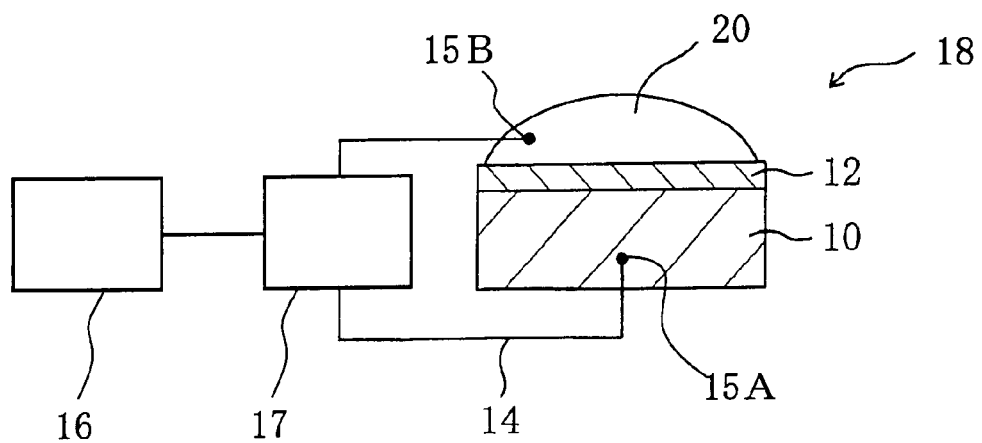
FIG. 1A is a sectional view schematically illustrating a constitution of an electronic component pickup device according to a preferred embodiment of the present invention.

Hereinafter, preferred embodiments of the present invention are described referring to the drawings. The inventors of the present invention has examined a problem to be generated in the future based on an accelerated downsizing of an electronic component, namely, a subject matter, so called, transportation and mounting of an electronic component. As a result of the examination, it was known that the electronic component would be further downsized to such a size level that can be hardly held with a holding tool in the future, and it is very difficult at the same time to pick up, transport and mount the electronic component with a vacuum suction mechanism.

It is not necessarily impossible to pick up, transport and mount the electronic component further reduced in comparison to the current sizes if any technical breakthrough is carried out by the improvement of the conventional technology. However, the inventors of the present invention searched a whole new technology in place of merely improving the conventional technology. Various possibilities have been studied and finally it was found that a method of picking up, transporting and mounting the minute electronic component by utilizing a surface tension of a liquid was effective. However, there remained still such an unsolved problem that it is difficult to release the electronic component even if it can be adsorbed by means of the surface tension of the liquid.

Further, it is also an important issue to control a working time in each step in an actual process. More specifically, it is not applicable merely by realizing the adsorption and release of the electronic component through the surface tension, and a technology for controlling a working time for the adsorption and release to a reasonable level is demanded.

Based on the before-mentioned aspects, the inventors of the present invention keenly examined a method where not only the surface tension of the liquid was utilized and but also the liquid was speedily controlled, and finally reached the present invention. Hereinafter, the preferred embodiments are described referring to the drawings. In the drawings, constituent elements substantively having a same function are provided with a same reference symbol in order to simplify the description. The present invention is not limited to the following preferred embodiment. Description is given to an electronic component transporting method according to a preferred embodiment of the present invention referring to FIGS. 1A, 1B and 2.

Figure 1B:
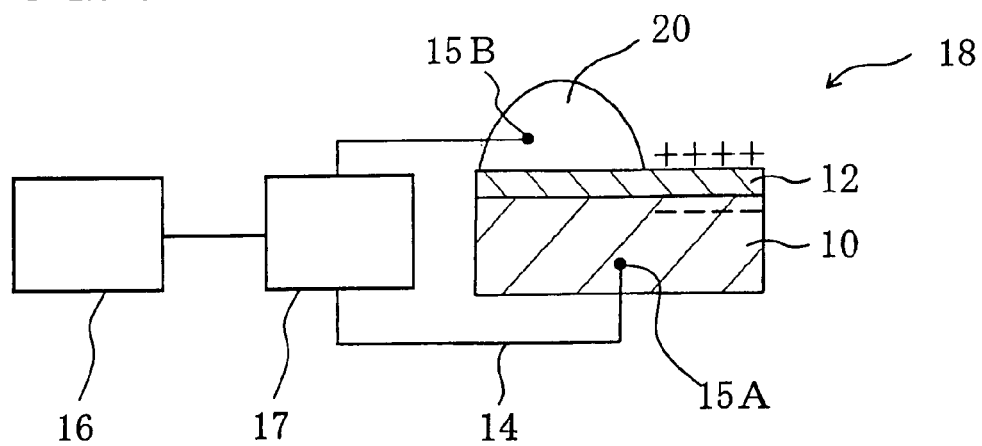
FIG. 1B is a sectional view schematically illustrating a constitution of the electronic component pickup device according to the preferred embodiment.

FIGS. 1A and 1B schematically show a constitution of an electronic component pickup device 100 used in the present preferred embodiment. The electronic component pickup device 100 described here is a device exclusively used for picking up and retaining an electronic component having a small size such as a chip-type electronic component. The electronic component pickup device 100 comprises a conductive layer 10, an insulation layer 12, an electrolytic solution 20, a power supply 16, a power-supply controller 17, and electrodes 15A and 15B. The insulation layer 12 is laminated on the conductive layer 10 and comprises surface constituting a pickup surface on which the electronic component is retained. The electrolytic solution 20 is provided on the conductive layer 10 under a state where the insulation layer 12 is interposed. The power supply 16 supplies power to the electronic component pickup device 100, and the electrodes 15A and 15B are connected to both output ends of the power supply 16 via a wiring 14. The electrode 15A is connected to the conductive layer 10, and the electrode 15B contacts the electrolytic solution 20. Accordingly, a voltage is applied from the power supply 16 to the conductive layer 10 and the electrolytic solution 20 via the electrodes 15A and 15B. The power-supply controller 17 adjusts the voltage applied from the power supply 16. In the present preferred embodiment, the power supply 16 and the power-supply controller 17 constitute a voltage supply unit, and the electrolytic solution 20 constitutes an electronic component retaining liquid.

The electronic component pickup device 100 utilizes the electro-wetting phenomenon to control a wet area (wettability) of the electrolytic solution 20 on the insulation layer 12. The electro-wetting phenomenon is a phenomenon where a surface tension between the electrolytic solution and the substrate surface is changed by changing a charge density in vicinity of a substrate surface contacted by the electrolytic solution, and, as a result, the wet area between the substrate and the electrolytic solution (wettability) is changed.

In the electronic component pickup device 100 comprising the structure where the electro-wetting phenomenon is generated, the voltage (preferably, direct-current voltage) is applied between the electrodes 15A and 15B so that the wet area (wettability) between the electrolytic solution 20 and the substrate (insulation layer 12 in the present preferred embodiment) can be changed. As a result, the area on the substrate contacted by the electrolytic solution 20 can be changed. In the electro-wetting phenomenon, a response speed of the electro-wetting phenomenon (adjusting rate of height of electrolytic solution) is as fast as 10 ms, and the wettability can be more quickly controlled in comparison to the electrophoretic method.

In the state shown in FIG. 1A, a low-level voltage $V_1$ on a low-voltage side of a voltage-applicable region of the power supply 16 or a high-level voltage $V_2$ on a high-voltage side thereof ($V_1 < V_2$) is applied from the power supply 16 between the conductive layer 10 and the electrolytic solution 20 in the electronic component pickup device 100. Then, as shown in FIG. 1B, when the voltage is increased from $V_1$ to $V_2$, a charge state on the insulation layer (dielectric layer) 12 is changed so as to increase a surface tension between the electrolytic solution 20 and the insulation layer 12. As a result, a wet area of the electrolytic solution 20 on the substrate is reduced and the contact area of the electrolytic solution 20 is decreased. In the electronic component pickup device 100 according to the present preferred embodiment, the wet area of the electrolytic solution 20 is controlled by such an action so that the electronic component is picked up and released. The pickup and release of the electronic component by the electronic component pickup device 100 will be described later in relation to an electronic component transporting device 200 incorporated the electronic component pickup device 100.

Next, the electronic component transporting device 200 in which the electronic component pickup device 100 is incorporated is described referring to FIG. 2. FIG. 2 is a block diagram showing a constitution of the electronic component transporting device 200. In FIG. 2 and the sequent drawings, the conductive layer 10, insulation layer 12, electrolytic solution 20 and electrodes 15A and 15B are collectively recited as a pickup device main body 18. The electronic component transporting device 200 comprises the electronic component pickup device 100, a motor 101 for moving the pickup device main body (hereinafter, referred to as motor), a component coordinate memory 102, a component memory 103, a component direction memory 104 and a controller 105. In the present preferred embodiment, the motor 101 for moving the pickup device main body constitutes a mover, and the component coordinate memory 102, component memory 103, component direction memory 104 constitute a memory.

The motor 101 reciprocates the pickup device main body 18 between a plurality of transportation positions. The plurality of transportation positions includes a preparatory position of each electronic component (position where the electronic component is stored or the like; hereinafter, referred to as original position α) and a carry-in position of each electronic component (position where the electronic component is mounted; hereinafter, referred to as destination β). The component coordinate memory 102 memorizes a position information of each electronic component. The position information includes a coordinate information of the original position α of each electronic component and a coordinate information of the destination β of each electronic component. The component memory 103 includes data in relation to shape, pickup conditions, release conditions and the like of the respective electronic components). The component direction memory 104 memorizes an information in relation to a direction where an electronic component 30 is arranged at the original position α and the destination β. The controller 105 controls the operation of the motor 101 and the operation of the pickup device main body 18 based on the information memorized in the component coordinate memory 102, component memory 103 and component direction memory 104. In the case where the information in relation to the direction where the electronic component 30 is arranged at the original position α and the destination β is unnecessary, the component direction memory 104 is omitted.

Figure 3:
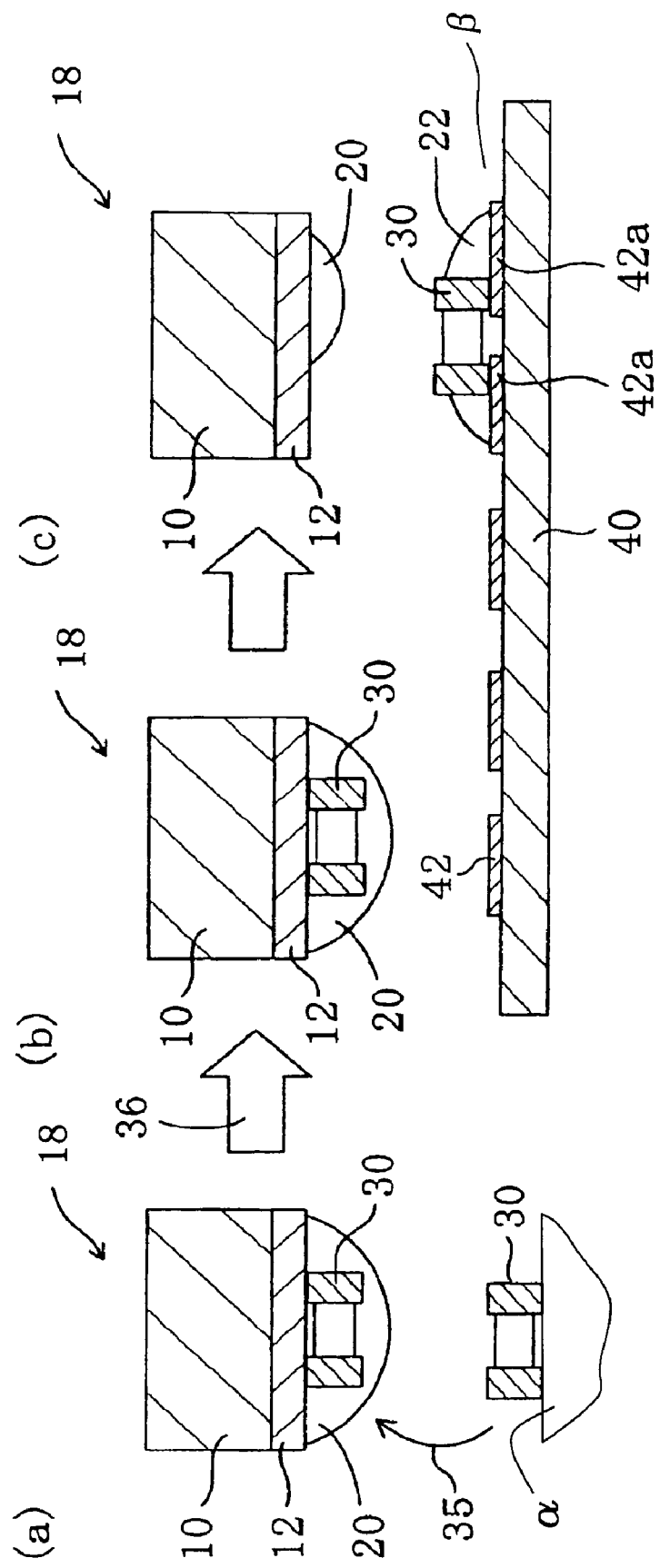
FIG. 3 is a process drawing illustrating a method of transporting and mounting an electronic component according to the preferred embodiment.

The operation of the electronic component transporting device 200, that is, the one of the pickup, transportation and release of the electronic component is described below. FIG. 3 is a process drawing illustrating the transportation of the electronic component 30 by the electronic component transporting device 200. First, the controller 105, as a pre-processing in picking up the electronic component 30, controls the power supply 16 via the power supply controller 17 to thereby apply the low-level voltage $V_1$ between the electrolytic solution 20 and the conductive layer 10. The low-level voltage $V_1$ to be applied may be a ground voltage. Accordingly, the charge state is changed, which reduces the surface tension of the electrolytic solution 20. As a result, the wet area of the electrolytic solution 20 on the insulation layer 12 becomes such an area that can retain the electronic component on the surface of the insulation layer 12 (pickup surface) via the electrolytic solution 20. In the foregoing state, as shown in FIG. 3 (a), the motor 101 is activated so that the pickup device main body 18 is brought closer to the original position α of the electronic component 30. Then, the electrolytic solution 20 of the pickup device main body 18 is made to contact the electronic component 30 so that the electronic component 30 is fetched into the electrolytic solution 20 by the surface tension thereof and retained on the surface of the insulation layer 12 (pickup surface) (see Arrow 35).

After the electronic component 30 is picked up, the controller 105 activates the motor 101 to thereby move the pickup device main body 18 from the original position α to the destination β of the electronic component 30 as shown in FIG. 3 (b). At the time, the low-level voltage is continuously applied. At the destination β, the pickup device main body 18 is arranged immediately above the destination β of the electronic component 30. An example of the destination β is an electronic component mounting pattern section on a circuit substrate on which the electronic component 30 is mounted.

After the transportation operation as described above is carried out, the controller 105 controls the power-supply controller 17 to thereby change the voltage to be applied between the electrolytic solution 20 and the conductive layer 10 from the low-level voltage $V_1$ to the high-level voltage $V_2$. Thereby, the charge state is changed, and the surface tension of the electrolytic solution 20 is thereby increased. As a result, the wet area of the electrolytic solution 20 on the insulation layer 12 becomes such an area that is difficult to retain the electronic component 30 on the surface of the insulation layer 12 (pickup surface) via the electrolytic solution 20. The electronic component 30 is then separated from the surface of the insulation layer 12 and moved to the destination β as shown in FIG. 3 (c), and the release is completed.

In the pickup, transportation, release of the electronic component 30, the controller 105 reads the information concerning the original position α and the destination β of the electronic component 30 to be mounted (coordinate information and the like) from the component coordinate memory 102, and the pickup conditions and release conditions of the electronic component 30 to be mounted from the component memory 103 respectively, and controls to drive the motor 101 based on the obtained information.

A mechanism wherein the electro-wetting phenomenon is utilized to pick up and release the electronic component is described. The wet area of the electrolytic solution 20 in the state where the low-level voltage $V_1$ is applied to the pickup device main body 18 is substantially equal to or larger than the size of the electronic component 30. A dropping amount of the electrolytic solution 20 is set so that the wet area can have such a dimension.

When the pickup device main body 18 is made to contact the electronic component 30 at the original position α in the state where the low-level voltage $V_1$ is applied, the electronic component 30 is adsorbed to the pickup device main body 18 due to the wettability of the electrolytic solution 20 to the electronic component 30. Meanwhile, in the state where the high-level voltage $V_2$ is applied to the pickup device main body 18, the surface tension of the electrolytic solution 20 is increased, as a result of which the wet area between the electrolytic solution 20 and the insulation layer 12 is reduced as much as possible so as to become a size smaller than that of the electronic component 30. Therefore, when the high-level voltage is applied ($V_2$) at the destination β, the electronic component 30 can hardly be held on the surface of the insulation layer 12 (pickup surface) via the electrolytic solution 20 and released to the destination β.

In addition, when the pickup device main body 18 is brought closer to the electronic component 30 in the state where the high-level voltage $V_2$ is applied at the original position α on the contrary to the foregoing description, the electronic component 30 cannot be picked up. At the original position α, the electronic component 30 can be picked up only in the state where the low-level voltage $V_1$ is applied.

As shown in FIG. 3 (b), the pickup device main body 18 is then transferred from the original position α to the destination β in the state where the electronic component 30 is adsorbed thereto by the surface tension of the electrolytic solution 20 (see Arrow 36). At the time, the low-level voltage $V_1$ is continuously applied. In the example shown, the pickup device main body 18 is transported to an upper position of a wiring substrate 40.

After that, as shown in FIG. 3 (c), the electronic component 30 reached to the destination β is released from the pickup device main body 18. In the present example, the electronic component 30 is released onto a land (electrode) 42a of the wiring substrate 40. When the electronic component 30 is released, the voltage controller 17 increases the voltage applied to the electrolytic solution 20 from the low-level voltage $V_1$ to the high-level voltage $V_2$. Thereby, the surface tension of the electrolytic solution 20 is increased, and the wet area between the electrolytic solution 20 and the insulation layer 12 is smaller than the size of the electronic component 30. Therefore, it becomes difficult for the electronic component 30 to be retained on the surface of the insulation layer 12 (pickup surface) via the electrolytic solution 20, and the electronic component 30 is separated from the insulation layer 12 due to its own weight or the wettability of the wiring substrate 40 to the electrolytic solution 20 and moves to the destination β (land 42a of the wiring substrate 40 or the like) downward. When the wettability of the electrolytic solution 20 at the destination β is maintained at a favorable level, the electronic component 30 can be easily moved together with the electrolytic solution 20 to the destination β (land 42a). By doing this, the electronic component 30 can be released from the pickup device main body 18 to the destination β (land 42a of the wiring substrate 40 or the like) in a state where impacts given to the electronic component 30 and the destination β due to the movement of the electronic component 30 are reduced.

As described so far, in the present preferred embodiment, pick-up and release process of the electronic component 30 is implemented by adjusting the wet area of the electrolytic solution 20 in the electronic component main body 18 by means of the electro-wetting phenomenon. The electronic component 30 adsorbed to the electrolytic solution 20 is released to the destination β (wiring substrate 40) due to change of the wet area. When the electronic component 30 is released, it is preferable that a droplet (liquid) 22 is selectively supplied to the destination β and a periphery thereof. Accordingly, the electronic component 30 can be moved from the electrolytic solution 20 to the droplet (liquid) 22 while the impacts generated by the fall of the electronic component 30 are further reduced in the release step. As described earlier, however, even in the structure where the droplet 22 is not provided at the destination β (land 42a), the electronic component 30 can be easily placed on the destination β (land 42a) together with the electrolytic solution 20 as far as the favorable wettability of the electrolytic solution 20 is obtained at the destination β.

Figure 4A:
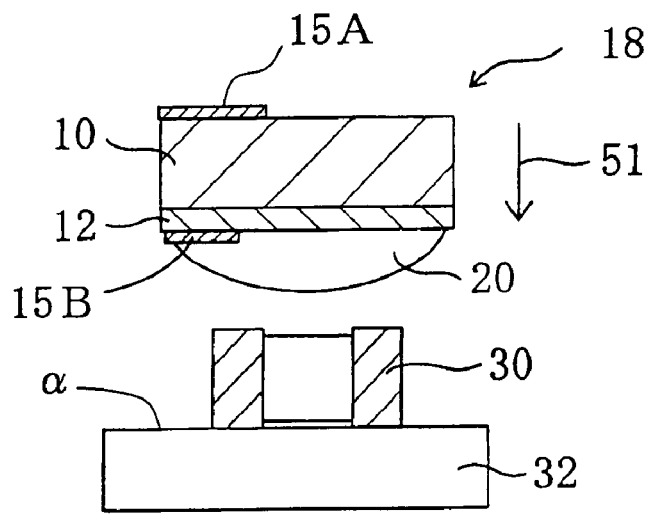
FIG. 4A is a first sectional process drawing of a pickup process in the method of transporting and mounting the electronic component according to the preferred embodiment.
Figure 4B:
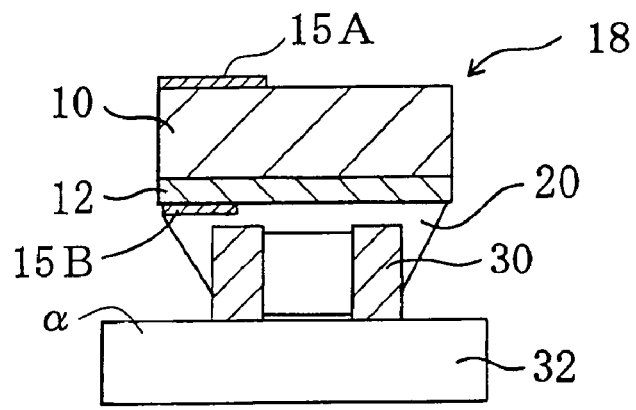
FIG. 4B is a second sectional process drawing of the pickup process in the method of transporting and mounting the electronic component according to the preferred embodiment.
Figure 4C:
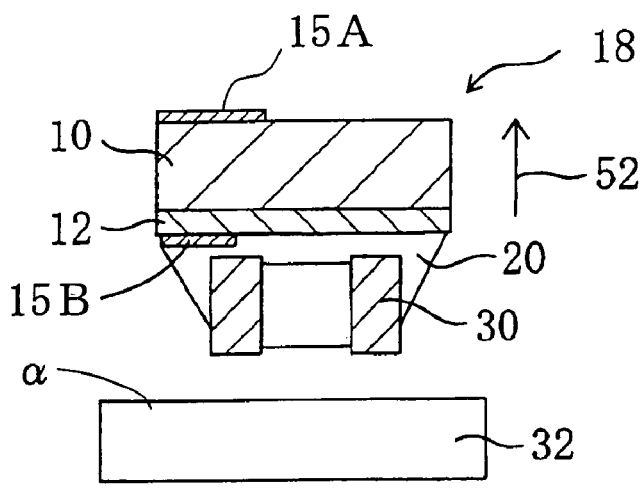
FIG. 4C is a third sectional process drawing of the pickup process in the method of transporting and mounting the electronic component according to the preferred embodiment.

Next, the pickup process is further described referring to FIGS. 4A-4C. As shown in FIG. 4A, the electronic components 30 are stored at the original position α (for example, on the substrate 32 at the original position), and the pickup device main body 18 is moved toward one of the electronic components 30. At the time, the power-supply controller 17 applies the low-level voltage $V_1$ between the electrode 15A on the conductive-layer-10 side and the electrode 15B on the insulation-layer-12 side. Either one or a plurality of electronic components 30 may be provided on the substrate 32. In the shown structure, the pickup device main body 18 is moved downward as shown by Arrow 51 so that the electrolytic solution 20 is brought closer to the electronic component 30.

Next, as shown in FIG. 4B, the pickup device main body 18 is descended so that the electrolytic solution 20 contacts the electronic component 30. Then, the electrolytic solution 20 invades into a periphery of the electronic component 30 by its surface tension, and the electronic component 30 is thereby drawn closer to the pickup device main body 18 (more specifically, insulation layer 12) via the electrolytic solution 20 and retained.

Thereafter, as shown in FIG. 4C, when the pickup device main body 18 is lifted upward as shown by Arrow 52, the electronic component 30 is separated from the substrate 32 and then moves upward in a state of being retained by the electrolytic solution 20. At the time, the low-level voltage $V_1$ is continuously applied. If the pickup device main body 18 is moved in the foregoing state, the electronic component 30 can be transported along with the movement.

Figure 5A:
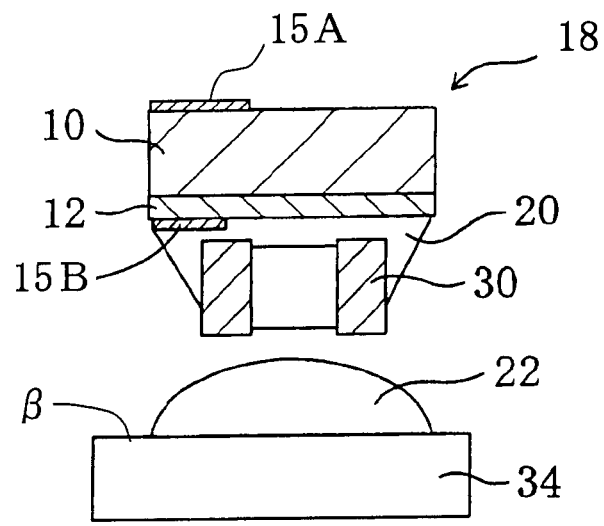
FIG. 5A is a first sectional process drawing for illustrating a release process in the method of transporting and mounting the electronic component according to the preferred embodiment.
Figure 5B:
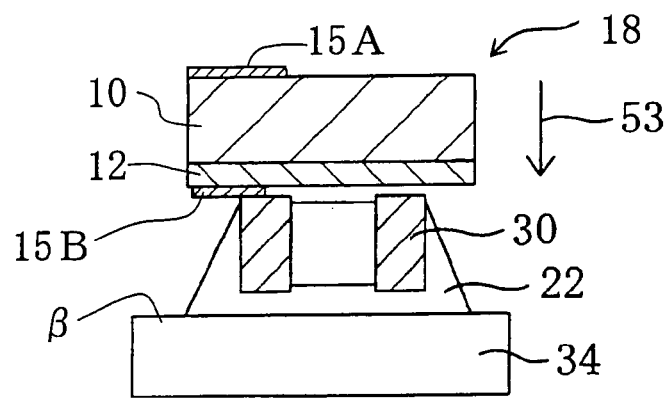
FIG. 5B is a second sectional process drawing illustrating the release process in the method of transporting and mounting the electronic component according to the preferred embodiment.
Figure 5C:
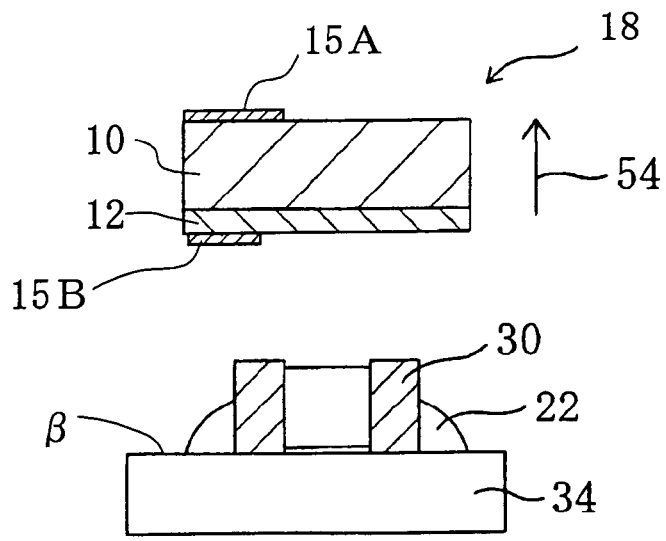
FIG. 5C is a third sectional process drawing illustrating the release process in the method of transporting and mounting the electronic component according to the preferred embodiment.

Next, the release process is further described referring to FIGS. 5A-5C. As shown in FIG. 5A, the pickup device main body 18 which is retaining the electronic component 30 is moved to the destination β (for example, on the substrate 34 at the destination), and performs positioning to the destination β. An example of the substrate 34 as the destination β is the wiring substrate 40 shown in FIG. 3 (c). It is preferable that the droplet (liquid) 22 is selectively supplied to the destination β (or example, position where the component is arranged on the substrate 34). The droplet 22 is preferable to be a liquid having such a property that can be absorbed with the electrolytic solution 20.

Next, as shown in FIG. 5B, the pickup device main body 18 is moved in a direction shown by Arrow 53 (downward in the drawing) so as to contact the droplet 22 on the substrate 34. Immediately before the contact, the voltage being applied to the pickup device main body 18 is increased from the low-level voltage $V_1$ to the high-level voltage $V_2$. The surface tension of the electrolytic solution 20 is thereby reduced, which reduces the wet area between the electrolytic solution 20 and the insulation layer 12. As a result, the adhesion strength between electrolytic solution 20 and the insulation layer 12 is reduced. Therefore, when the electrolytic solution 20 contacts the droplet 22, the electrolytic solution 20 is separated from the insulation layer 12 and absorbs with the droplet (liquid) 22, then, moves to the substrate-34 side. Along with the movement of the electrolytic solution 12, the electronic component 30 moves to the droplet (liquid) 22 side on the substrate 34.

Next, the pickup device main body 18 is moved in a direction shown by Arrow 54 (upward in the drawing) so that the pickup device main body 18 is completely separated from the electronic component 30. Then, the release of the electronic component 30 is completed. If the droplet (liquid) 22 surrounding the electronic component 30 is evaporated, the mounting process can be implemented.

When the electro-wetting phenomenon is thus utilized, the surface energy (surface tension) of the electrolytic solution 20 to the insulation layer 12 is adjusted so that the shape of the electrolytic solution 20 can be changed. In the present preferred embodiment, the pickup and the release of the electronic component 30 are thus realized by adjusting the wet area of the electrolytic solution 20 on the insulation layer 12 and the component retaining force by the electrolytic solution 20 by use of the phenomenon.

In the pickup process shown in FIGS. 5A-5C, the shape of the electrolytic solution 20 can be changed by the electro-wetting phenomenon. In the pickup process, however, it is a target to make the electrolytic solution 20 and the electronic component 30 contact each other so as to fetch the electronic component 30 into the electrolytic solution 20. Therefore, the electro-wetting phenomenon may or may not be utilized as far as the electronic component 30 can be fetched.

The pickup device main body 18 is formed from, for example, the following materials. The conductive layer 10 is formed from metal such as a copper plate or a stainless steel plate. In the present preferred embodiment, the conductive layer 10 is formed from a metal stainless steel (SUS) plate. The insulation layer 12 is formed from resin, epoxy resin, polyimide resin or the like. In the present preferred embodiment, the insulation layer 12 is formed from a copper foil coated with epoxy resin. The electrodes 15A and 15B (in particular, electrode 15B) is formed from a material obtained in such a manner that a copper foil coated with epoxy resin is adhered and cured to the conductive layer (SUS plate) 10 and then a part of the resin is removed.

In order to largely reduce the surface tension between the liquid and the insulation film by the application of the relatively low voltage as the high-level voltage $V_2$ in the electro-wetting phenomenon, it is necessary to generate a lot of charges on an interface between the electrolytic solution 20 and the insulation layer 12. Therefore, the electrolytic solution 20 is provided in the present invention. The electrolytic solution 20 includes a water-soluble electrolytic solution (for example, 1 mM of KCl or the like) or an organic solvent. The electrolytic solution 20 can consist of a mixture of a water solution and an organic solvent (for example, water and alcohol), and a two-phase substance (for example, it may be solved by alcohol such as ethanol, propanol, butanol, pentanol, hexanol, ethyleneglycol, and glycerin, ether such as ethyleneglycol ethylether or ethyleneglycol monobutylether, ketons such as methylethylketone, or alkane such as hexan, octane or nonane). As examples of the water-soluble electrolytic solution, there are NaCl water solution, NaBr water solution, $NH_4Cl$ water solution, buffer solution including various salts, and the like other than the foregoing examples. In the electrolytic solution in which the organic solvent is used, acetic anhydride, methanol, tetrahydrofuran, propylene carbonate, nitromethane, acetonitrile, dimethylformamide, dimethylsulfoxide, or hexamethyl phosphoamide can be used as the solvent, and $NaClO_4$, $LiClO_4$, KOH, $KOCH_3$, $NaOCH_3$, LiCl , $NH_4Cl$, n-$(CH_3C_3H_6)_4Ni$, Mg $(ClO_4)_2$, $NaBF_4$ or the like can be used as the electrolytic substance. Further, an alcohol-based solvent, various esters, aliphatic carbon hydride, cycloaliphatic carbon hydride, aromatic carbon hydride or halogenated carbon hydride including a small amount of water-soluble electrolytic solution, or various types of oils can be also used. The amount of salt or electrolytic substance is not particularly limited as far as the electro-wetting phenomenon can be generated. For example, the amount is at least $10^{-4}$ weight % and at most 30 weight %.

The droplet 22 may consist of either an electrolytic solution or liquid other than the electrolytic solution. The same substance as or a substance similar to the electrolytic solution 20 of the pickup device main body 18 can be used as the droplet 22. Additionally, if it is desirable for the droplet 22 to evaporate relatively soon after the electronic component 30 is moved, volatile liquid (for example, alcohol) can be used.

Figure 6A:
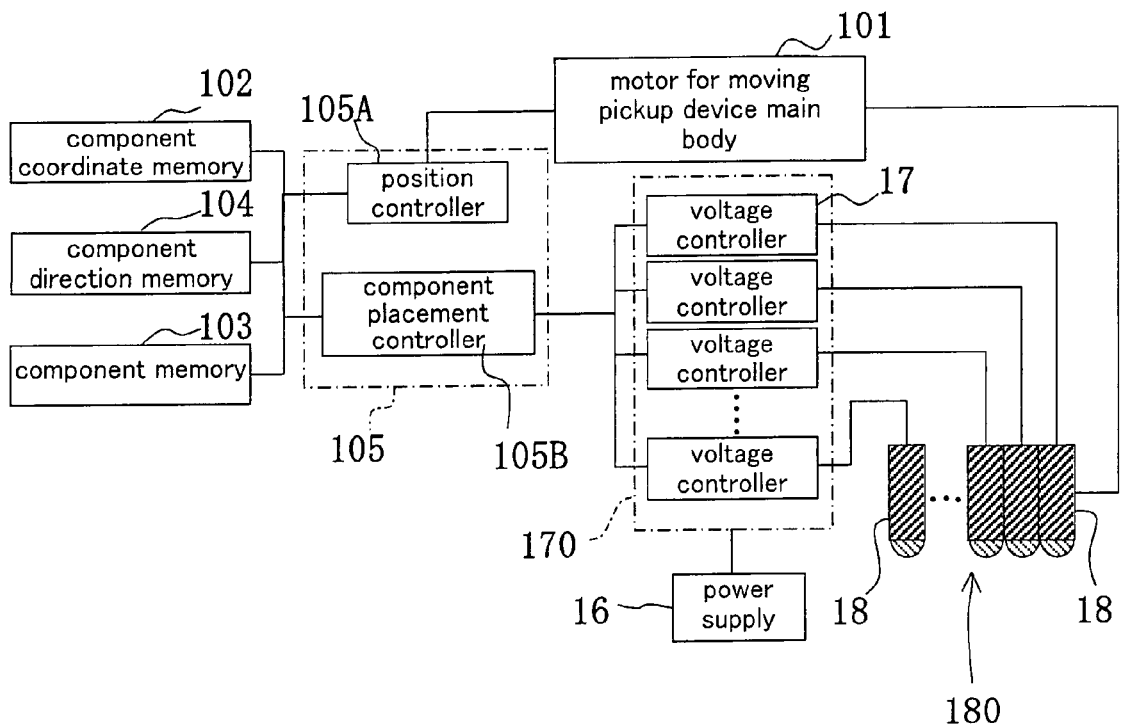
FIG. 6A is a block diagram showing a constitution of an electronic component transporting device according to another preferred embodiment of the present invention.
Figure 6B:
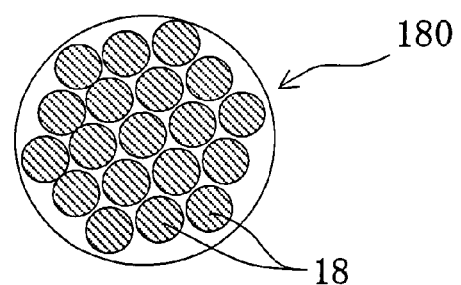
FIG. 6B shows a constitution of a pickup device main body according to the another preferred embodiment in the electronic component transporting device according to the present invention.

As shown in FIG. 6A, a multi-line pickup 180 where a plurality of pickup device main bodies 18 is constituted in multi-line may be provided so that a plurality of electronic components 30 can be simultaneously picked up, transported and released. In this case, a plurality of voltage controllers 17 is provided in accordance with the plurality of pickup device main bodies 18, which constitutes a group of voltage controllers 170. Further, in order to separately control directions and positions of the respective pickup device main bodies 18 constituting the multi-line pickup 180, the controller 105 comprises a position controller 105A for controlling a coordinate center of the plurality of electronic components 30 and a component placement controller 105B for controlling the directions of the plurality of electronic components 30. As an example of the structure of the multi-line pickup 180, the plurality of pickup device main bodies 18 may be bundled in a cylindrical shape and connected to one another as shown in FIG. 6B. FIG. 6B is a bottom surface of the multi-line pickup 180.

Figure 7:
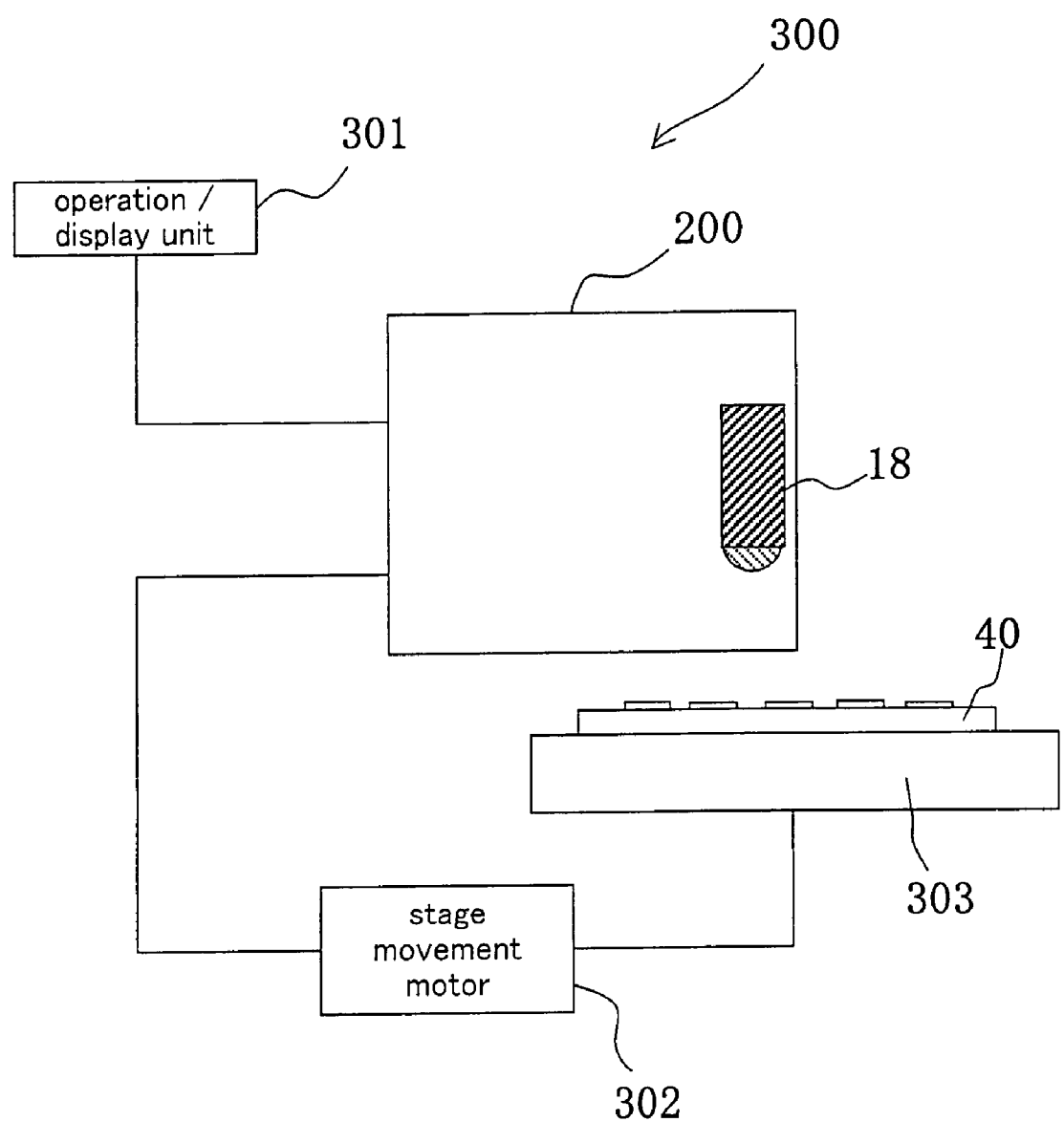
FIG. 7 is a block diagram showing a constitution of an electronic component mounting device according to the preferred embodiment.

Next, an electronic component mounting device 300 in which the transporting device 200 is incorporated is described referring to FIG. 7. The electronic component mounting device 300 comprises the transporting device 200, an operation/display unit 301 and a stage movement motor 302. The operation/display unit 301 accepts an operation by an operator who handles the electronic component mounting device 300, and displays various information that the operator demands in the operation. The stage movement motor 302 enforces to move a stage 303 on which the wiring substrate 40 for mounting the electronic component 30 is arranged relatively to the pickup device main body 18. In the present preferred embodiment, the stage movement motor 302 constitutes a stage mover.

Figure 8A:
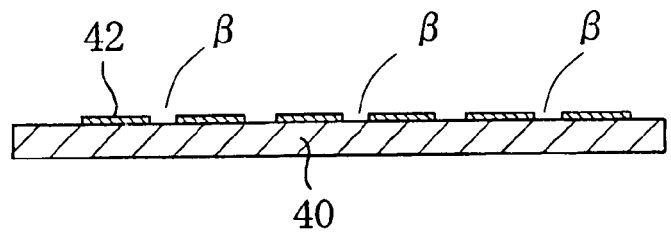
FIG. 8A is a first sectional process drawing for transporting and mounting the electronic component onto a wiring substrate.

Description is given to the transportation and mounting operations of the electronic component 30 on the wiring substrate 40 by the electronic component mounting device 300 referring to FIGS. 8A-8D. First, as shown in FIG. 8A, the wiring substrate 40, which is the destination of the electronic component 30 (where the electronic component is mounted), is prepared. Wiring patterns 42 are previously formed on the wiring substrate 40. The wiring substrate 40 may be a rigid substrate or a flexible substrate. Further, the wiring substrate 40 is not necessarily limited to a one-surface wiring substrate or a both-surface wiring substrate, and may be a multi-layer wiring substrate. A wiring substrate such as a component-incorporated substrate and a rigid flexible substrate may be used as the wiring substrate 40. It is needless to say that a circuit substrate on which the electronic component is already mounted can be used as the wiring substrate 40.

Figure 8B:
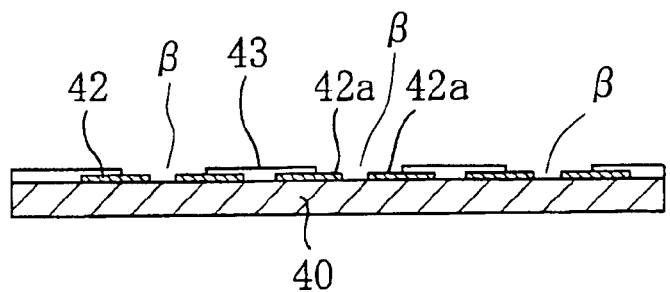
FIG. 8B is a second sectional process drawing for transporting and mounting the electronic component onto the wiring substrate.

Next, as shown in FIG. 8B, a water-repellent layer (water-repellent pattern) 43 is formed on the wiring substrate 40 except for the destination β (mounting position). The water-repellent layer 43 is formed so that the droplet 22 can be surely and easily formed at the destination β.

The water-repellent layer 43 is formed from photosensitive water/oil-repellent resin. The water-repellent layer 43 according to the present preferred embodiment is formed from a UV-hardening resist film manufactured by NIPPON PAINT COL, LTD. Silicon and acrylic block polymer constitute the material, and more specifically, the material has a sea-island structure of silicon and acryl (so-called silicon island). The silicon is characterized in its low surface tension, and the acryl serves to control modification, hardness, adhesion, UV-curing of the resin. A contact angle between the formed water-repellent layer 43 and water is 100°-105°, and liquid (water or the like) provided on the water-repellent layer 43 has a fall angle of 20°-40° when the water-repellent layer 43 is tilted. A contact angle in the wettability of the liquid (water or the like) in the region where the water-repellent layer 43 is removed is 40°-45°.

The water-repellent layer 43 is formed, for example, as follows. An entire surface of the wiring substrate 40 is coated with a water-repellent material. More specifically, spin coating is adopted to apply the water-repellent material in a thickness of 1-2 μm. Next, the applied water-repellent material is pre-baked (for 30 minutes at 120° C.), and then exposed so as to have a predetermined pattern. The exposure is conducted in 300 mj/cm² by means of UV. Next, the exposed material is baked for 30 minutes at 120° C., and dipped in toluene for 1-2 minutes and developed. When a post baking process is finally applied at 120° C. for 10 minutes, the water-repellent layer 43 is formed.

When the fluorine/acrylic block polymer manufactured by ASAHI GLASS CO., LTD. is used as the photosensitive water/oil-repellent resin, the water-repellent layer (water-repellent pattern) 43 having the water/oil-repellent property can be formed by means of the photolithographic process with the i beam.

Figure 8C:
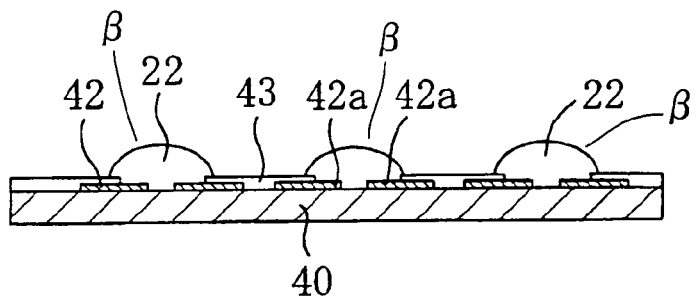
FIG. 8C is a third sectional process drawing for transporting and mounting the electronic component onto the wiring substrate.

As shown in FIG. 8C, the droplet 22 is formed on the wiring substrate 40 on which the water-repellent layer 43 is formed. Formation of the droplet is carried out as below. The droplet 22 is formed on the wiring substrate 40 except for the water-repellent layer 43 when a liquid for the droplet 22 is sprayed on the entire wiring substrate 40. The droplets 22 do not cause any problem in the mounting of the electronic component.

Figure 9:
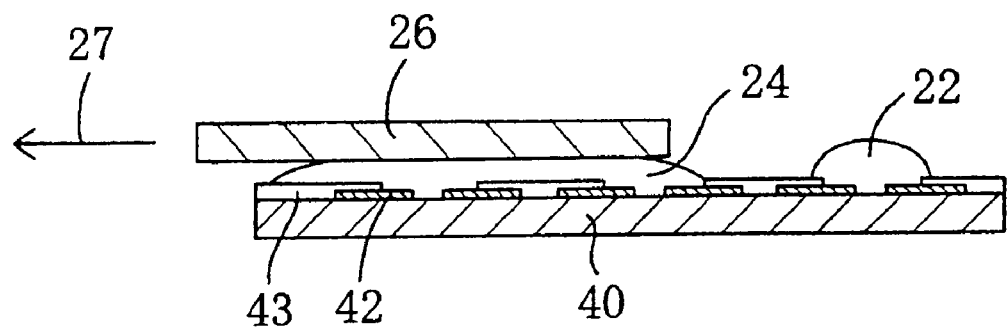
FIG. 9 is a sectional process drawing illustrating a droplet forming process.

The droplet 22 may be formed by means of a method shown in FIG. 9 in place of the spray. More specifically, the liquid 24 for forming the droplet 22 is dropped on the entire surface of the wiring substrate 40, and then, a slide plate (for example, slide glass) 26 is made to contact the liquid 24. The slide plate 26 is arranged in parallel with the wiring substrate 40 in a state where a predetermined small interval is formed between them. As a result, the liquid 24 is spread onto the entire surface of the wiring substrate 40. Then, the slide plate 26 is slid in parallel with the wiring substrate 40 under the state (see Arrow 27). Thereby, the droplet 22 is formed on the place except for the water-repellent layer 43.

Figure 8D:
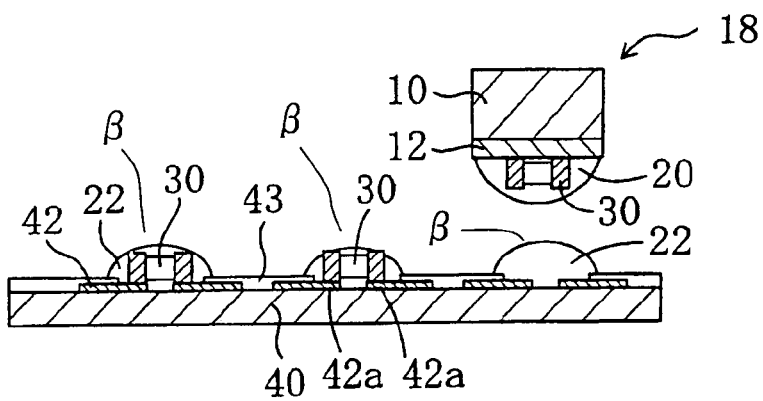
FIG. 8D is a fourth sectional process drawing for transporting and mounting the electronic component onto the wiring substrate.

After the droplet 22 is formed, the electronic component 30 is transported from the original position α to the destination β (a part on the wiring substrate 40 where the water-repellent layer 43 is not formed) by the electronic component mounting device 300 as shown in FIG. 8D. After that, the electronic component 30 is transported to the destination β on the wiring substrate 40 and mounted thereon by means of the method described referring to FIGS. 5A-5C. When the electronic component 30 is mounted, the droplet (liquid) 22 surrounding the electronic component 30 transported to the destination β is evaporated, the electronic component 30 can be mounted on the wiring substrate 40. Further, in the mounting process, the wiring substrate 40 is moved relatively to the pickup device main body 18 by the stage movement motor 302 so that positioning of the electronic component 30 retained in the pickup device main body 18 and the wiring substrate 40 can be accurately carried out.

Figure 10A:
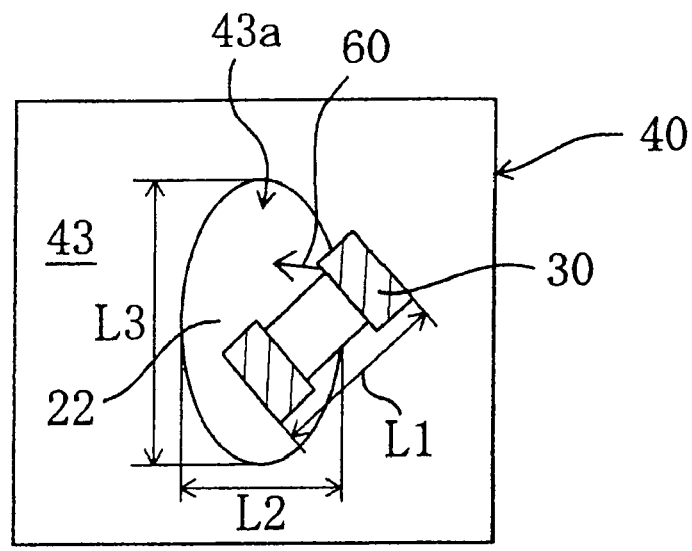
FIG. 10A is a first process drawing illustrating a position aligning process based on self-aligning of the electronic component.
Figure 10B:
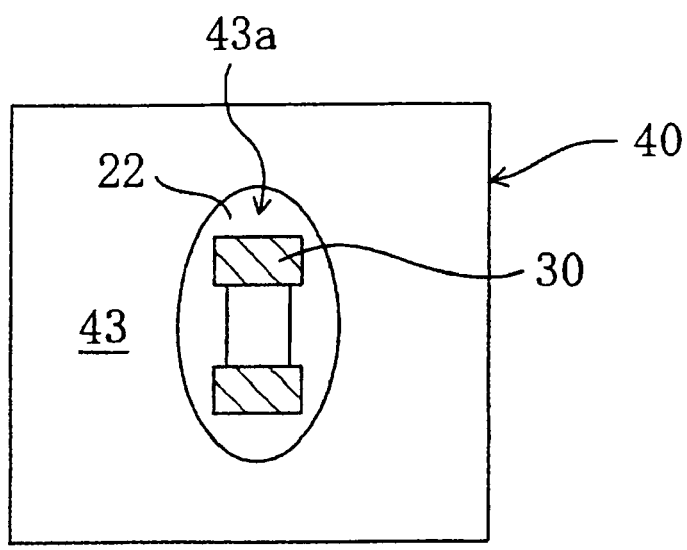
FIG. 10B is a second process illustrating the position aligning process based on the self-aligning of the electronic component.

In the mounting method according to the present preferred embodiment, the droplet 22 is used to mount the electronic component 30 on the wiring substrate 40. Therefore, the electronic component 30 can be mounted based on self-aligning, which is described below referring to FIGS. 10A and 10B. FIGS. 10A and 10B show an upper view of a main part of the wiring substrate 40, wherein the water-repellent layer 43 and the droplet 22 are shown.

First, as shown in FIG. 10A, an opening part 43a of the water-repellent layer 43 is formed corresponding to the shape of the electronic component 30, the droplet 22 is formed in a shape similar to that of the opening part 43a. The shape corresponding to that of the electronic component 30 means that a length L3 of a longer side of the opening part 43a is set to be larger than a length L1 of the electronic component 30 in a longitudinal direction thereof, and a length L2 of a shorter side of the opening part 43a is set to be smaller than the length L1. The electronic component 30 can be arranged in any desired direction in the droplet 22, that is, at the destination β by forming the opening part 43a in such a shape.

In the constitution shown in FIG. 10A, the electronic component 30 housed in the droplet 22 is moved/rotated by the surface tension of the droplet 22 as shown by Arrow 60, and located at the center of the droplet 22 (or center of the opening part 43a) by the self-aligning as shown in FIG. 10B. Thereby, position of the electronic component 30 is adjusted so that the direction of the electronic component 30 corresponds to that of the opening part 43a. Therefore, the electronic component 30 can be arranged and mounted at a predetermined position by the self-aligning action of the droplet 22 even though the retaining position of the electronic component 30 is more or less unfavorable when it is picked up through the electronic component pickup device 100.

The control of the direction of the electronic component 30, which was described referring to FIGS. 10A and 10B, is realized by adjusting the shape of the droplet 22 arranged at the destination β. The direction of the electronic component 30 can also be controlled through improving on the structure of the pickup device 19 and the control of the applied voltage to the pickup device 19 by the voltage controller 17 as shown in FIGS. 11A-11C.

An improved pickup device 19' is particularly characterized in the shape of the electrode 15C provided on the insulation-layer-12 side. FIGS. 11A-11C show the electrode 15C observed from the electrolytic-solution side (pickup-surface side of the electronic component). The electrode 15C comprises a main electrode $15C_1$ having a circular shape and a plurality (eight in total in the present example) of satellite electrodes $15C_2$ through $15C_9$ and coupling electrodes $15C_{10}$. The main electrode $15C_1$ and the satellite electrodes $15C_2$ through $15C_9$ have a circular or polygonal shape (circular in the drawing), and a size of the main electrode $15C_1$ is larger than those of the satellite electrodes $15C_2$ through $15C_9$. The satellite electrodes $15C_2$ through $15C_9$ are radially arranged at an equal angle (45° in the present example) one another with the main electrode $15C_1$ as their center. The main electrode $15C_1$ and the satellite electrodes $15C_2$ through $15C_9$ have a same separation distance one another. The coupling electrodes $15C_{10}$ are arranged between the main electrode $15C_1$ and the satellite electrodes $15C_2$ through $15C_9$ and couple the main electrode $15C_1$ and the respective satellite electrodes individually. A voltage controller 17' supplies a voltage individually to the main electrode $15C_1$ and the satellite electrodes $15C_2$ through $15C_9$. A pair of the satellite electrodes $15C_2$ through $15C_9$ respectively arranged on diagonal lines with the main electrode $15C_1$ as their center, main electrode $15C_1$, and coupling electrode $15C_{10}$ connecting these electrodes constitute a linear electrode part. A plurality of linear electrode parts thus constituted is radially provided with the main electrode $15C_1$ as their center.

When the electrolytic solution 20 is dropped on the electrode 15C in a state where the low-level voltage $V_1$ is applied to the entire electrode 15C (voltage is not necessarily applied), the electrolytic solution 20 is equally adhered to the main electrode $15C_1$, satellite electrodes $15C_2$ through $15C_9$, and coupling electrode $15C_{10}$, which is shown in FIG. 11A. When the pickup device 19' is moved to the original position α in the foregoing state so that the electronic component 30 contacts the electrolytic solution 20, the electronic component 30 is picked up by the pickup device 19 in a random state without fixing the direction thereof due to the direction thereof in an initial stage of the pickup, various pickup conditions, environmental conditions and the like. More specifically, the electronic component 30 is principally adsorbed by the main electrode $15C_1$, however, the electrode component 30 is rotated around the main electrode $15C_1$ as a center based on the above-described conditions because the electrolytic solution 20 is adhered to all of the satellite electrodes $15C_2$ through $15C_9$, and the direction thereof is not constant, which is shown in FIG. 11B.

Consequently, the voltage applied to the electrode 15C is adjusted by the voltage controller 17' as follows. The adjustment of the applied voltage by the voltage controller 17' is described based on the assumption that the direction of the electronic component 30 having a rectangular shape is adjusted so that the longitudinal direction thereof follows a vertical direction in the drawing as shown in FIG. 11C. In this case, the voltage controller 17' applies the high-level voltage $V_2$ to the satellite electrodes $15C_3$-$15C_5$ and $15C_7$-$15C_9$ other than the satellite electrodes $15C_2$ and $15C_6$ vertically opposing to each other in the drawing and the main electrode $15C_1$. The low-level voltage $V_1$ is continuously applied to the satellite electrodes $15C_2$ and $15C_6$ and the main electrode $15C_1$. Accordingly, the satellite electrodes $15C_3$-$15C_5$ and $15C_7$-$15C_9$ to which the high-level voltage $V_2$ is applied selectively exert the water-repellent property, and the electrolytic solution 20 adhered to these satellite electrodes $15C_3$-$15C_5$ and $15C_7$-$15C_9$ moves to the linear electrode part including the satellite electrodes $15C_2$ and $15C_6$ and the main electrode $15C_1$ which do not exert the water-repellent property. Therefore, the electronic component 30 to which the wettability of the electrolytic solution 20 is good changes its direction in the vertically long direction in the drawing (direction along the linear electrode part which does not exert the water-repellent property) in accordance with the changing shape of the electrolytic solution 20. As a result, the electronic component 30 follows the vertical direction shown in the drawing.

The voltage application control to the main electrode $15C_1$, satellite electrodes $15C_3$-$15C_5$ and $15C_7$-$15C_9$, and coupling electrodes $15C_{10}$ described above is implemented by, for example, the position controller 105A and the component placement controller 105B shown in FIG. 6A.

In the foregoing description, the shapes of the main electrode $15C_1$ and the satellite electrodes $15C_2$-$15C_9$ are circular or polygonal, however, may have an arbitrary shape. Further, it is assumed that the interval angle of the satellite electrode $15C_2$-$15C_9$ is 45°, and the direction of the electronic component 30 is controlled at the interval of 45°, however, any other angle position may be adopted. For example, the interval angle of the satellite electrodes $15C_2$-$15C_5$ is set to 90°, and the direction of the electronic component 30 is controlled at the interval of 90° in FIG. 12.

In the control of the direction of the electronic component 30 described above, it is preferable that the conductive layer 10 and the insulation layer 12 are constituted in a manner similar to the electrode 15C. However, a similar effect can be obtained in the case where only the electrode 15C alone is constituted as described.

The electronic component 30 used in the present preferred embodiment is preferable to be an electronic component having a small size, and, for example, an electronic component 30 having a side whose length is at most 0.2 mm is suitably used. Examples of the electronic component 30 are a chip component (for example, chip capacitor, chip inductor, or chip resistor) and a semiconductor element (for example, semiconductor bare chip).

In the case where the electronic component 30 is the chip component, the method according to the present preferred embodiment can be suitably applied to a component having the size of "0402" which is currently the smallest size, and even to a component having a size smaller than that, for example, a component having a side whose length is at most 0.1 mm ("01005" or the like). In the case where the electronic component 30 is the semiconductor bare chip, the method can be suitably applied to a semiconductor bare chip having the size of 0.3 mm in square, which is currently the smallest size, and a semiconductor bare chip having a side whose length is at most 0.1 mm.

Though the present invention exerts a remarkable effect to a minute size of the electronic component 30 which was hardly picked up or could not be picked up according to the conventional technology, however, it is needless to say that the effect of the present invention is not limited to such a minute component. The electronic component 30 to which the present invention is applied does not necessarily be limited to such a micro size because such effects as the superior response speed of the electronic component pickup device 100 and the movement between the electrolytic solution 20 and the droplet 22 can be utilized. The electronic component pickup device in which the chip is held with the holding tool involves the risk of breaking the electronic component, however, the constitution according to the present invention can accurately mount the electronic component without any breakage.

The present invention was thus far described based on the preferred embodiments, and the recitations so far are not subject to any limitation and can be variously modified. In the preferred embodiments, a method of using the electrolytic solution 20 is described in the pickup and transporting method in which the electro-wetting phenomenon is utilized. In the case where solder powder is used in addition to the electrolytic solution, as the electrolytic solution is vaporized, and the solder powder is dissolved through re-flowing after mounting of the electronic component, the electronic component and the desired wiring pattern on the wiring substrate can be electrically connected to each other. A solder plating such as Sn is previously applied to the electrode on the wiring substrate so that the solder plating of the electrode of the electronic component is dissolved at the time of the reflow and electrically connected to the electrode on the wiring substrate.

Further, though it is essentially different from the technology according to the preferred embodiments of the present invention, there is a component transporting device in which a surface tension of liquid is utilized, as recited in the Japanese Patent Applications Laid-Open (No. H11-68388, No. 2004-108907, No. 2005-33014). However, the inventions recited in these documents do not disclose the transportation of the component in such a manner that the component is held by means of the electro-wetting phenomenon, and the technical ideas are quite different from that of the preferred embodiments of the present invention.

Though the preferred embodiments of this invention have been described in detail, it will be understood that various modifications may be made therein, and it is intended to cover in the appended claims all such modifications as fall within the true spirit and scope of this invention.

What is claimed is:

1. An electronic component transporting method comprising:
    a first step for preparing a pickup device comprising a pickup surface to which an electronic component retaining liquid is to be applied and capable of adjusting a wet area of the electronic component retaining liquid on the pickup surface and applying the electronic component retaining liquid to the pickup surface; and
    a second step for retaining the electronic component on the pickup surface via the electronic component retaining liquid in a state in which the wet area is extended the pickup device further comprising a conductive layer and an insulation layer laminated on the conductive layer so as to comprise a surface constituting the pickup surface is prepared as the pickup device, and an electrolytic solution to which a voltage can be applied between the electrolytic solution and the conductive layer is prepared as the electronic component retaining liquid in the first step, and the voltage is set on a low-voltage side in a region where the voltage is applicable so that the wet area of the electrolytic solution on the insulation layer is extended in the second step.

2. The electronic component transporting method according to claim 1, wherein
    the voltage is set on a low-voltage side in a region where the voltage is applicable, and the electrolytic solution is made to contact the electronic component in the state where the wet area of the electrolytic solution on the insulation layer is extended by weakening a surface tension of the electrolytic solution so that the electronic component is retained on the pickup surface by the surface tension of the electrolytic solution in the second step.

3. The electronic component transporting method according to claim 1, further comprising a third step for separating the electronic component from the pickup surface in a state in which the wet area is narrowed after the second step is implemented.

4. The electronic component transporting method according to claim 3, wherein
    the voltage is set on a high-voltage side in a region where the voltage is applicable so that the wet area of the electrolytic solution is narrowed in the third step.

5. The electronic component transporting method according to claim 3, wherein
    the voltage is set on a high-voltage side in a region where the voltage is applicable, and the electronic component is separated from the pickup surface in a state where the wet area of the electrolytic solution is narrowed by increasing a surface tension of the electrolytic solution in the third step.

6. The electronic component transporting method according to claim 5, wherein
    the electrolytic solution is made to contact a destination to which the electronic component is transported so that the electronic component is moved from the pickup surface together with the electrolytic solution to the destination in the third step.

7. The electronic component transporting method according to claim 3, wherein
    the second step is implemented after the pickup device is moved to an original position of the electronic component, and
    the third step is implemented after the pickup device is moved together with the electronic component from the original position to the destination.

8. The electronic component transporting method according to claim 1, wherein
    a side length of the electronic is at most 0.2 mm.

9. The electronic component transporting method according to claim 8, wherein
    the electronic component is a chip component, and a side length of the chip component is at most 0.1 mm.

10. The electronic component transporting method according to claim 8, wherein
    the electronic component is a semiconductor bare chip, and a side length of the semiconductor bare chip is at most 0.3 mm.

11. An electronic component mounting method, wherein
    the destination is a wiring substrate on which the electronic component is mounted, and
    the electronic component is arranged at a mounting position of the wiring substrate by means of the electronic component transporting method according to claim 7.

12. The electronic component mounting method according to claim 11, further comprising a fourth step for providing a droplet on the electronic component mounting part prior to the third step, wherein
    the electronic component retained by the electrolytic solution is made to contact the droplet and thereby moved to the droplet in the third step.

13. The electronic component mounting method according to claim 12, wherein
    a water-repellent layer is formed on a surface of the wiring substrate on which the electronic component mounting part is formed except for the electronic component mounting part, and the droplet is then provided on the surface on which the electronic component mounting part is formed in the fourth step.

14. The electronic component mounting method according to claim 13, wherein
    the droplet is provided on the electronic component mounting part in a shape corresponding to the electronic component in the fourth step, and
    the electronic component is arranged at the electronic component mounting part in accordance with a shape of the droplet based on self-aligning in the third step.

15. An electronic component pickup device capable of retaining an electronic component, comprising:
    a conductive layer;

an insulation layer laminated on the conductive layer so as to comprise a pickup surface for retaining the electronic component on the surface thereof;

an electrolytic solution provided on the pickup surface; and a power supply unit for applying a voltage in a switching manner between the electrolytic solution and the conductive layer, wherein the voltage power supply unit applies a voltage between the electrolytic solution and the conductive layer when the electric component is separated; said voltage being higher than the voltage applied between the electrolytic solution and the conductive layer when the electronic component is held.

16. The electronic component pickup device according to claim 15, wherein the voltage supply unit sets the applied voltage on a low-voltage side in a voltage-applicable region of the voltage supply unit so that a surface tension of the electrolytic solution is weakened and a wet area of the electrolytic solution on the insulation layer is extended when the electronic component is held, and the voltage supply unit further sets the applied voltage on a high-voltage side in the voltage-applicable region so that the surface tension of the electrolytic solution is increased and the wet area of the electrolytic solution on the insulation layer is narrowed when the electronic component is separated.

17. The electronic component pickup device according to claim 15, wherein a side length of the electronic is at most 0.2 mm.

18. The electronic component pickup device according to claim 17, wherein the electronic component is a chip component, and a side length of the chip component is at most 0.1 mm.

19. The electronic component pickup device according to claim 17, wherein the electronic component is a semiconductor bare chip, and a side length of the semiconductor bare chip is at most 0.3 mm.

20. An electronic component transporting device comprising:

the electronic component pickup device according to claim 15;

a mover for moving the electronic component pickup device from an original position of the electronic component to a destination of the transportation;

a memory for memorizing data concerning the transportation of the electronic component; and a controller for controlling the mover based on the data memorized in the memory, wherein the voltage supply unit sets the applied voltage on a low-voltage side in a voltage-applicable region during a period when the electronic component pickup device is at an original position and a period when the electronic component pickup device is moved from the original position to a destination of the transportation, and the voltage supply unit further sets the applied voltage on a high-voltage side in the voltage-applicable region at the destination.

21. The electronic component transporting device according to claim 20, wherein the mover makes the electrolytic solution contact the electronic component so that the electronic component is retained on the pickup surface through the electrolytic solution whose wet area is extended at the original position, and the mover further makes the electrolytic solution contact the destination so that the electronic component is separated from the pickup surface together with the electrolytic solution whose wet area is narrowed and moved to the destination.

22. The electronic component transporting device according to claim 20, wherein, the voltage supply unit includes an electrode for applying the voltage on a surface of the insulation layer, and the electrode comprises a plurality of linear electrode parts arranged in a radial shape, and the voltage supply unit supplies the voltage individually to the linear electrode parts in accordance with a desired direction of the electronic component when the electronic component is held.

23. An electronic component mounting device according to the present invention comprising:

the electronic component transporting device according to claim 20; and a stage mover for moving a wiring substrate provided at the destination on which the electronic component is mounted relatively to the electronic component transporting device.

* * * * *